United States Patent [19]

Shin

[11] Patent Number: 5,805,019

[45] Date of Patent: Sep. 8, 1998

[54] VOLTAGE GAIN AMPLIFIER FOR CONVERTING A SINGLE INPUT TO A DIFFERENTIAL OUTPUT

[75] Inventor: Yun Tae Shin, Kyoungkido, Rep. of Korea

[73] Assignee: Hyundai Electronics Industries Co., Ltd., Kyoungkido, Rep. of Korea

[21] Appl. No.: 718,716

[22] Filed: Sep. 24, 1996

[51] Int. Cl.$^6$ ......................................... H03F 3/45
[52] U.S. Cl. .................. 330/9; 330/51; 330/86; 330/260; 330/282; 330/301
[58] Field of Search ................... 330/9, 51, 86, 330/260, 275, 282, 301

[56] References Cited

U.S. PATENT DOCUMENTS 4,574,250  3/1986  Senderowicz .......................... 330/51 X Primary Examiner—James B. Mullins
Attorney, Agent, or Firm—Jacobson, Price, Holman & Stern, PLLC

[57] ABSTRACT

The present invention relates to a voltage gain amplifier for converting a single analog input to a differential output and controlling a voltage gain, comprising a single input charging/discharging part, a differential output operational amplifier, a first and second input voltage transferring part, a first and second voltage holding part and a frequency compensating part, and therefore, making it possible to generate a differential input signal, which is used as an input to an ADC(Analog-to-Digital Converter) of an audio CODEC(Coder/Decoder), by using a fully-differential output operational amplifier whose output is transmitted as a differential output. Also, the present invention gives an advantage of making the chip size smaller than the prior art does, resulting from the fact that resistors are replaced by capacitors and switches when integrated into a chip.

13 Claims, 4 Drawing Sheets

VOLTAGE GAIN AMPLIFIER FOR CONVERTING A SINGLE INPUT TO A DIFFERENTIAL OUTPUT

BACKGROUND OF THE INVENTION

1. Field of the Invention

The present invention relates to a voltage gain amplifier, which consists of analog switches, capacitors and a fully-differential amplifier, used for converting a single analog input to a differential output and controlling a voltage gain.

2. Description of the Prior Art

An Analog-to-Digital Converter(referred to hereinafter as ADC), which adopts an oversampling method in order to support Multimedia Audio and Coder/Decoder(referred to hereinafter as CODEC), uses a sigma-delta modulator that receives an analog signal as an input. The sigma-delta modulator needs a voltage gain amplifier for improving the signal-to-noise ratio and a differential input for improving the dynamic range and power supply rejection ratio.

FIG. 1 shows the schematic structure of a conventional voltage gain amplifier for processing an analog signal. FIG. 2 shows the structure of a conventional programmable voltage gain amplifier. FIG. 3 shows the structure of a conventional voltage gain amplifier for converting an analog signal to a differential output, in which A denotes am operational amplifier, R, $R_1$ to $R_{2^N+1}$ denote a registor and $S_1$ to $S_{2^N}$ denote a switch, respectively.

Referring to FIG. 1, the input voltage $V_{in}$ is inputted to an inversion input part of the operational amplifier A by way of the impedance $Z_1$, output voltage $V_{out}$ is fed back to the inversion input part of the operational amplifier A by way of the impedance $Z_2$, and the non-inversion input part is grounded.

Supposing that impedances $Z_1$, $Z_2$ are resisstors $R_1$, $R_2$, respectively, and $R_1$ is smaller than $R_2$, a voltage gain is:

$$\frac{\text{Output Voltage}(V_{out})}{\text{Input Voltage}(V_{in})} = -\frac{R_2}{R_1}$$

That is, the output voltage is amplified by $R_2/R_1$ times of the input voltage with an inverse polarity of the input voltage.

Referring to FIG. 2, signals $S_1 \sim S_{2^N}$ decoded by the N-bit decoder are used for selecting the switches of the voltage gain amplifier in order to output the desired voltage gain.

However, as this kind of a voltage gain amplifier can not be used as a differential input for a sigma-delta modulator, an inversion amplifier with a voltage gain of 1 is further required, as shown in FIG. 3. Therefore, the prior art has the drawbacks of a large chip size and a difficulty in integrating resistors on the chip.

SUMMARY OF THE INVENTION

It is an object of the present invention to provide a voltage gain amplifier for converting a single input to a differential output by discharging a charged voltage in a capacitor with an inverted polarity and a non-inverted polarity, which uses a fully-differential amplifier instead of a single-output inversion amplifier and also uses switches and capacitors instead of resistors, in order to improve the integration density.

In accordance with one aspect of the present invention, a voltage gain amplifier for converting a single input to a differential output includes:

a fully-differential output operational amplifying means, which has an inversion input terminal, a non-inversion input terminal, an inversion output terminal and a non-inversion output terminal, for amplifying the two inputted signals and then outputting the two amplified signals to a first output terminal and a second output terminal, respectively, the phase of the one output signal being opposite to the phase of the other output signal;

a first single input charging/discharging means, connected to said inversion input terminal of said fully-differential output operational amplifying means, for charging/discharging the input voltage $V_{in}$;

a second single input charging/discharging means for providing a signal whose phase is inversed compared with the phase of the signal provided by said first single input charging/discharging means, connected to said non-inversion input terminal of said fully-differential output operational amplifying means;

a first input voltage transferring means, of which one end is connected to said inversion input terminal of said fully-differential output operational amplifying means and the other end is connected to said first output terminal, respectively, for transferring the input voltage by a switching operation;

a second input voltage transferring means, of which one end is connected to said non-inversion input terminal of said fully-differential output operational amplifying means and the other end is connected to said second output terminal, respectively, for transferring the input voltage by a switching operation; and a frequency compensating means for outputting a first and second output voltage after compensating frequency such that the output signals of said fully-differential output operational amplifying means can be stably operated within a given bandwidth.

BRIEF DESCRIPTION OF THE ATTACHED DRAWINGS

DETAILED DESCRIPTION OF THE PREFERRED EMBODIMENT

Referring to the attached drawings, the preferred embodiment of the present invention will be fully explained. FIG.

Figure 5:
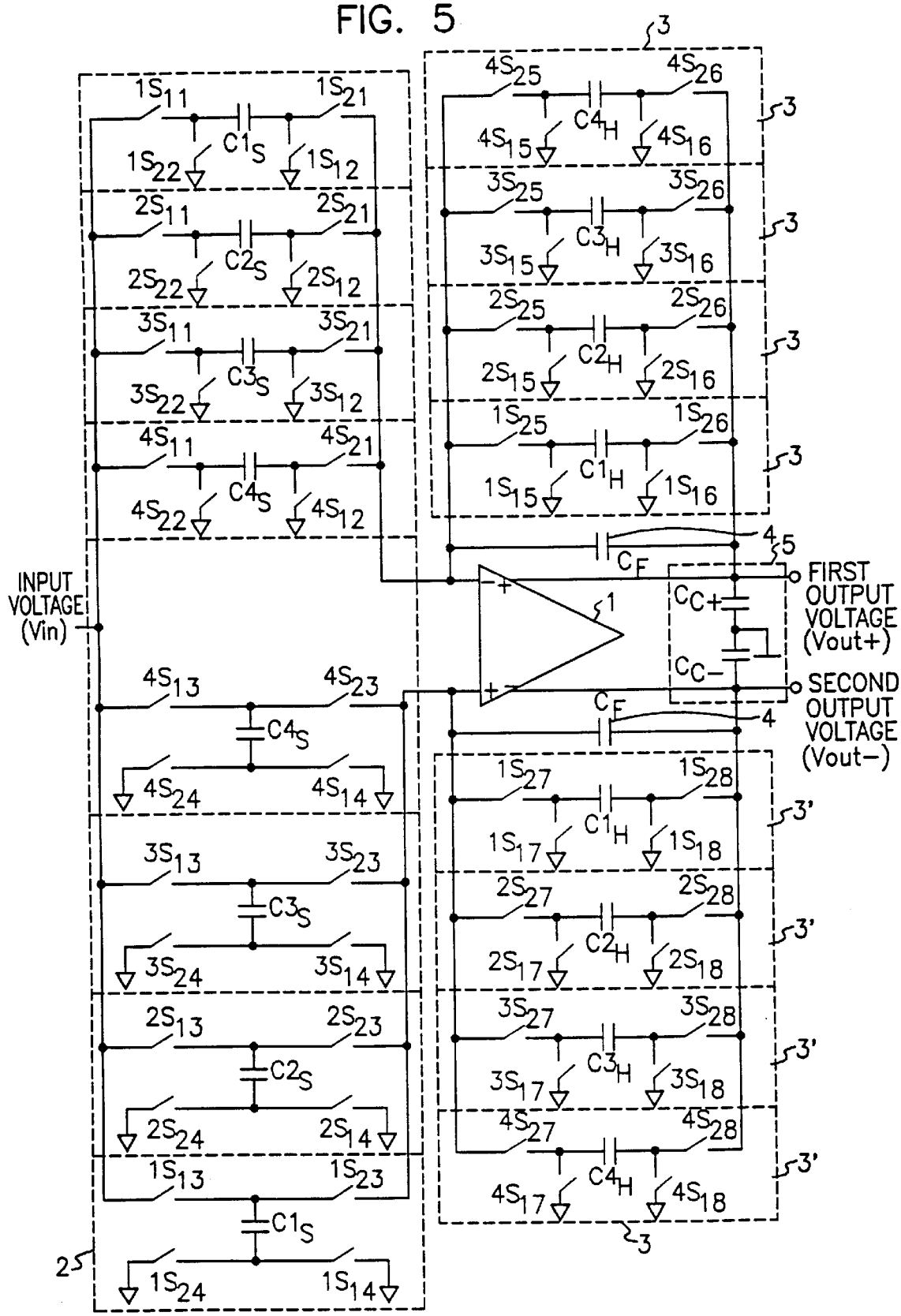
FIG. 5 shows a circuit diagram of the voltage gain amplifier in accordance with another embodiment of the present invention.

4 and FIG. 5 show the circuit diagram of the voltage gain amplifier in accordance with one embodiment and another embodiment of the present invention, wherein 1 denotes the fully-differential output operational amplifier, 2 denotes the single input charging/discharging part, 3 and 3' denote the input voltage transferring part, 4 and 4' denote the voltage holding part, and 5 denotes the frequency compensating part, respectively.

Figure 1:
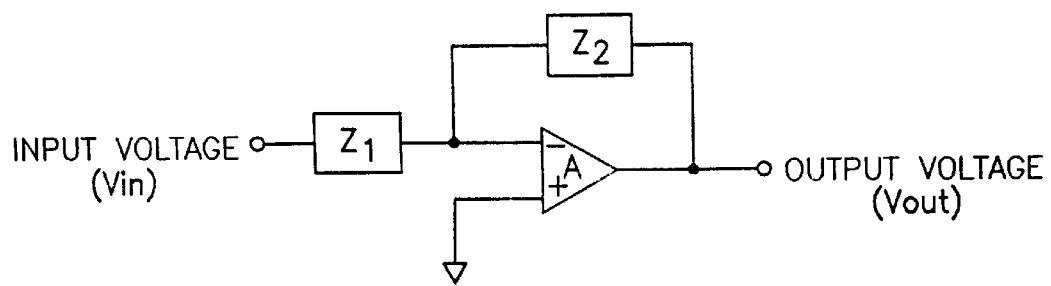
FIG. 1 shows a schematic diagram of a conventional voltage gain amplifier for an analog signal.
Figure 2:
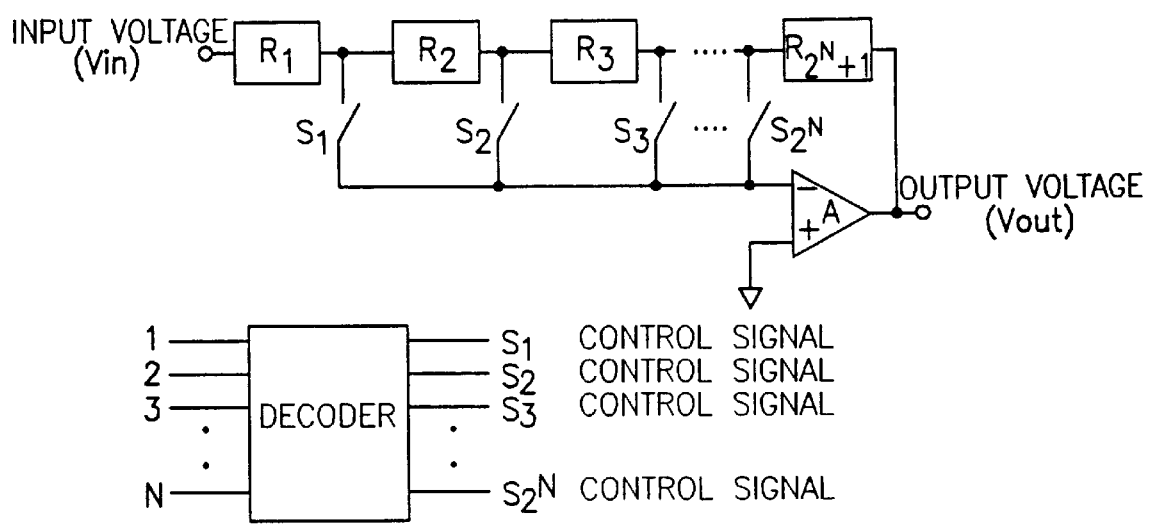
FIG. 2 shows a schematic diagram of a conventional programmable voltage gain amplifier.
Figure 3:
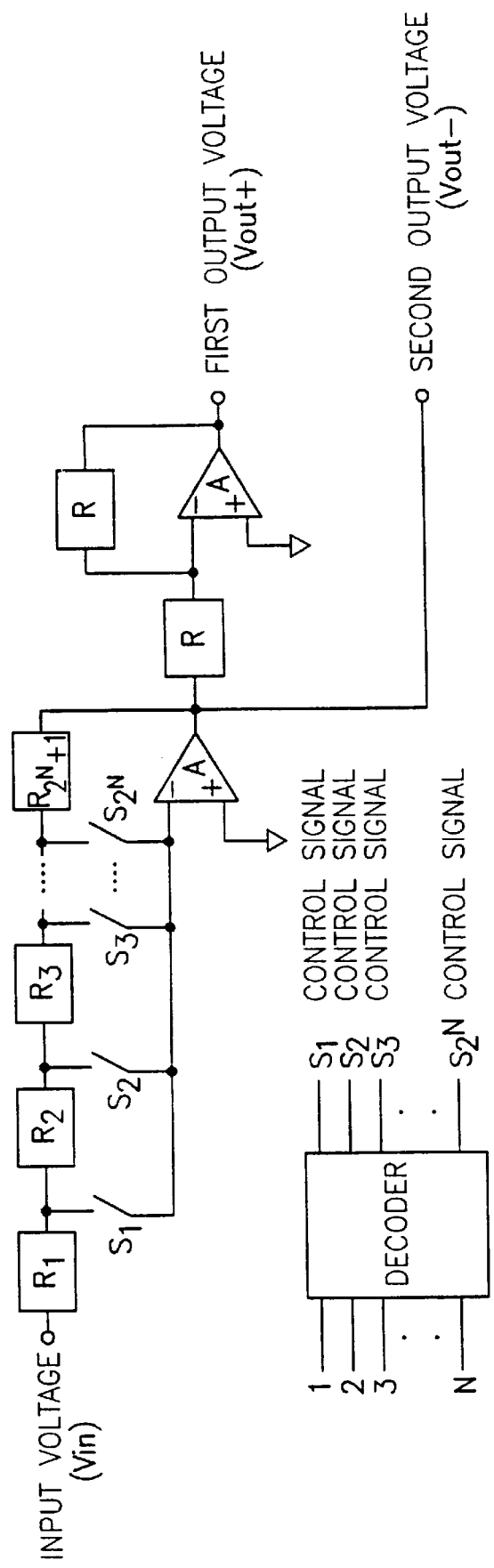
FIG. 3 shows a schematic diagram of a conventional voltage gain amplifier for converting a single input to a differential output.
Figure 4:
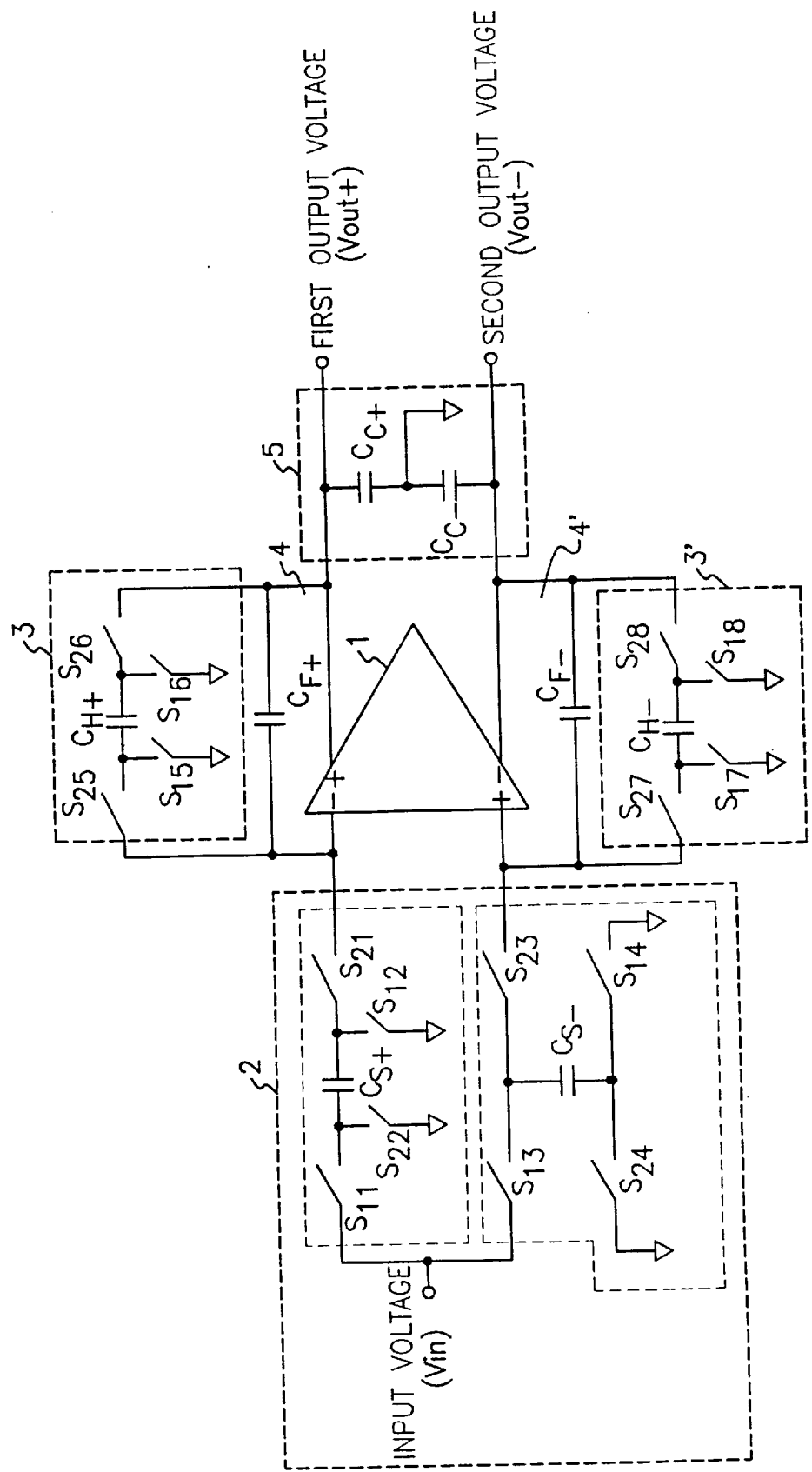
FIG. 4 shows a circuit diagram of the voltage gain amplifier in accordance with one embodiment of the present invention.

As shown in FIG. 4, the single input charging/discharging part 2 consists of a first and second charging/discharging part which can charge/discharge the single input voltage $V_{in}$ by means of the switching operation such that the phase of the output signal of said first charging/discharging part is opposite to the phase of the output signal of said second charging/discharging part but the amplitude of the two output signals is equal.

The fully-differential output operational amplifier 1 amplifies the amplitude of the fully-differential mode signals tramsmitted from an inversion and non-inversion input terminal, and then outputs the amplified signals whose phase is opposite each other to a first and second output terminal.

The input voltage transferring part 3, 3', connected to each input and output terminal of said fully-differential output operational amplifier 1, transfers an input voltage by a switching operation.

The voltage holding means 4, 4', connected to both ends of said input voltage transferring part 3, 3', decrease a high-frequency noise.

The frequency compensating part 5 outputs a first and second output voltage after compensating frequency such that the output signals of said fully-differential output operational amplifying means can be stably operated within a given bandwidth.

Referring to FIG. 4, the first charging/discharging part of said single input charging/discharging part 2 includes the switch $S_{11}$ for switching the input voltage $V_{in}$, the sampling capacitor $C_{S+}$ of which one end is connected to said switch $S_{11}$, the switch $S_{21}$ connected between the other end of said sampling capacitor $C_{S+}$ and the inversion input terminal of said fully-differential output operational amplifier 1, the switch $S_{22}$ connected between one end of said sampling capacitor $C_{S+}$ and the ground, and the switch $S_{12}$ connected between one end of said sampling capacitor $C_{S+}$ and the ground.

Also, the second charging/discharging part of said single input ch7/arging/discharging part 2 includes the switch $S_{13}$ for switching the input voltage $V_{in}$, the switch $S_{23}$ connected between said switch $S_{13}$ and the non-inversion input terminal of said fully-differential output operational amplifier 1, the sampling capacitor $C_{S-}$ connected between said switches $S_{13}$ and $S_{23}$, and switches $S_{14}$, $S_{24}$ connected in parallel between the sampling capacitor $C_{S-}$ and the ground.

Said input voltage transferring part 3 consists of the switch $S_{25}$ connected to the inversion input terminal of said fully-differential output operational amplifier 1, the capacitor $C_{H+}$ connected to said switch $S_{25}$, the switch $S_{26}$ connected between said capacitor $C_{H+}$ and the first output terminal, and the switches $S_{15}$, $S_{16}$ connected between both ends of said capacitor $C_{H+}$ and the ground.

Meanwhile, said input voltage transferring part 3' consists of the switch $S_{27}$ connected to the non-inversion input terminal of said fully-differential output operational amplifier 1, the capacitor $C_{H-}$ connected to said switch $S_{27}$, the switch $S_{28}$ connected between said capacitor $C_{H-}$ and the second output terminal, and switches $S_{17}$, $S_{18}$ connected between both ends of said capacitor $C_{H-}$ and the ground.

The voltage holding part 4 has the capacitor $C_{F+}$ whose one end is connected between the inversion input part of said fully-differential output operational amplifier 1 and said switch $S_{25}$ and the other end is connected between the first output terminal of said fully-differential output operational amplifier 1 and said switch $S_{26}$.

Also, the voltage holding part 4' has the capacitor $C_{F-}$ whose one end is connected between the non-inversion input part of said fully-differential output operational amplifier 1 and said switch $S_{27}$ and the other end is connected between the second output terminal of said fully-differential output operational amplifier 1 and said switch $S_{28}$.

The frequency compensating part 5 includes the capacitor $C_{C+}$ connected between the first output terminal and the ground, and the capacitor $C_{C-}$ connected between the second output terminal and the ground.

Meanwhile, a plurality of switches $S_{11}$~$S_{18}$, $S_{21}$~$S_{28}$ are a transmission gate or an NMOS transistor and have a switching operation that in case said switches $S_{11}$~$S_{18}$ are 'on', said switches $S_{21}$~$S_{28}$ are 'off' by means of the clock which applies to the gate, and on the contrary, in case said switches $S_{11}$~$S_{18}$ are 'off', said switches $S_{21}$~$S_{28}$ are 'on'. However, the clock frequency $f_C$ is the same.

When said switches $S_{11}$~$S_{14}$ of the single input charging/discharging part 2 become 'on', the input voltage $V_{in}$ minus the ground voltage $V_{ref}$ is charged in said sampling capacitors $C_{S+}$ and $C_{S-}$, and at the same time, a potential difference between both ends of said capacitors $C_{H+}$, $C_{H-}$ of the input voltage transferring part 3, 3' is 0 voltage.

Meanwhile, when said switches $S_{11}$~$S_{14}$ of the single input charging/discharging part 2 become 'off' and said switches $S_{21}$~$S_{24}$ of the single input charging/discharging part 2 become 'on', voltage $V_{in}-V_{ref}$, which was charged in said sampling capacitors $C_{S+}$ and $C_{S-}$, is applied to said inversion and non-inversion input terminal of the fully-differential output operational amplifier 1.

At this time, the two input terminal voltages have a different electric polarity from each other, and are discharged into said capacitors $C_{H+}$ and $C_{H-}$ of the input voltage transferring parts 3, 3'.

Thus, the ratio of the output voltage to the input voltage is:

$$\frac{V_{out+}}{V_{in}} = \frac{C_{S+}}{C_{H+}},$$

and $$\frac{V_{out+}}{V_{in}} = -\frac{C_{S-}}{C_{H-}}$$

Thus, the output voltage is amplified in case $C_{S+}$ is greater than $C_{H+}$. In the meantime, $C_{H+}$ is equal to $C_{H-}$, and $C_{S+}$ is equal to $C_{S-}$.

However, the output signal has high-frequency noises. These high-frequency noises can be eliminated by said capacitors $C_{F+}$, $C_{F-}$ of the voltage holding parts 4, 4' of which the cutoff-frequency, respectively, is:

$$\left|\frac{V_{out+}}{V_{in}}\right|_{f3dB} = \frac{f_c C_{F+}}{2\pi C_{H+}},$$

and $$\left|\frac{V_{out-}}{V_{in}}\right|_{f3dB} = \frac{f_c C_{F-}}{2\pi C_{H-}}$$

In the meantime, said capacitors $C_{C+}$ and $C_{C-}$ of the frequency compensating part 5 enable said fully-differential output operational amplifier 1 to operate stably within a given bandwidth.

Based on FIG. 4, FIG. 5 shows the circuit diagram of the voltage gain amplifier, wherein the voltage gain varies from 0 dB to +22.5 dB with an interval +1.5 dB. That is, 16 different voltage gains are obtained by turning 'on' and 'off' switches with the help of the switch control signal to which the 4-bit digital signal is decoded by the decoder.

As shown in FIG. 5, said single input charging/discharging part 2 is composed of 4 first charging/discharging parts whose inter-connection is parallel and 4 second charging/discharging parts whose inter-connection is also parallel. Also, said input voltage transferring parts 3, 3' have a 4-stage parallel connection, respectively.

Meanwhile, said capacitors $C_{1H}$, $C_{2H}$, $C_{3H}$, $C_{4H}$, $C_{1S}$, $C_{2S}$, $C_{3S}$, and $C_{4S}$ have the following relation:

$C_{1H} = C_{2H}$
$C_{3H} = 2\, C_{1H}$
$C_{4H} = 4\, C_{1H}$
$C_{1S} = C_{1H} + C_{2H} + C_{3H} + C_{4H} = 8\, C_{1H}$
$C_{2S} = 0.1885 \cdot C_{1S}$
$C_{3S} = 0.22404 \cdot C_{1S}$
$C_{4S} = 0.26626 \cdot C_{1S}$ As shown in FIG. 4, the clock signal generated by decoding the 4-bit digital signal enables each switch to become turned 'on' or 'off'.

For example, said switches $1S_{11} \sim 1S_{14}$, $1S_{21} \sim 1S_{24}$, $1S_{15} \sim 1S_{18}$, $1S_{25} \sim 1S_{28}$, $2S_{15} \sim 2S_{18}$, $2S_{25} \sim 2S_{28}$, $3S_{15} \sim 3S_{18}$, $3S_{25} \sim 3S_{28}$, $4S_{15} \sim 4S_{18}$, and $4S_{25} \sim 4S_{28}$ become turned 'on' or 'off' in order to obtain a gain of 0 dB. Said switches $1S_{11} \sim 1S_{14}$, $1S_{15} \sim 1S_{18}$, $2S_{15} \sim 2S_{18}$, $3S_{15} \sim 3S_{18}$, and $4S_{15} \sim 4S_{18}$ are operated by a clock signal whose phase is opposite to the phase of the clock signal which controls said switches $1S_{21} \sim 1S_{24}$, $1S_{25} \sim 1S_{28}$, $2S_{25} \sim 2S_{28}$, $3S_{25} \sim 3S_{28}$, and $4S_{25} \sim 4S_{28}$.

$NS_{cn}$ is a general expression for said switches, wherein N denotes the stage number, c denotes a clock phase, and n denotes the switch number.

Hence, a fully-differential output voltage gain is:

$$\frac{V_{out+}}{V_{in}} = \frac{C_{1S}}{C_{1H} + C_{2H} + C_{3H} + C_{4H}} = \frac{8C_{1H}}{8C_{1H}} = 0\text{ dB},$$

and $$\frac{V_{out-}}{V_{in}} = -\frac{C_{1S}}{C_{1H} + C_{2H} + C_{3H} + C_{4H}} = \frac{8C_{1H}}{8C_{1H}} = 0\text{ dB}$$

Using the clock signal which is manipulated in the above-mentioned method, a voltage gain can be obtained according to the following chart:

| order | switch on the operation | a ratio of the capacitor | gain [dB] |
|---|---|---|---|
| 0 | $1(S_{11} \sim S_{14}, S_{21} \sim S_{24})$, $(1 \sim 4)(S_{15} \sim S_{18}, S_{25} \sim S_{28})$ | $C_{1S}/(C_{1H} + C_{2H} + C_{3H} + C_{4H}) = 8C_{1H}/8C_{1H}$ | 0 |
| 1 | $(1 \sim 2)(S_{11} \sim S_{14}, S_{21} \sim S_{24})$, $(1 \sim 4)(S_{15} \sim S_{18}, S_{25} \sim S_{28})$ | $(C_{1S} + C_{2S})/(C_{1H} + C_{2H} + C_{3H} + C_{4H}) = 9.508C_{1H}/8C_{1H}$ | +1.5 |
| 2 | $(1 \sim 3)(S_{11} \sim S_{14}, S_{21} \sim S_{24})$, $(1 \sim 4)(S_{15} \sim S_{18}, S_{25} \sim S_{28})$ | $(C_{1S} + C_{2S} + C_{3S})/(C_{1H} + C_{2H} + C_{3H} + C_{4H}) = 11.3C_{1H}/8C_{1H}$ | +3.0 |
| 3 | $(1 \sim 4)(S_{11} \sim S_{14}, S_{21} \sim S_{24})$, $(1 \sim 4)(S_{15} \sim S_{18}, S_{25} \sim S_{28})$ | $(C_{1S} + C_{2S} + C_{3S} + C_{4S})/(C_{1H} + C_{2H} + C_{3H} + C_{4H}) = 13.43C_{1H}/8C_{1H}$ | +4.5 |
| 4 | $1(S_{11} \sim S_{14}, S_{21} \sim S_{24})$, $(1 \sim 3)(S_{15} \sim S_{18}, S_{25} \sim S_{28})$ | $C_{1S}/(C_{1H} + C_{2H} + C_{3H}) = 8C_{1H}/4C_{1H}$ | +6.0 |
| 5 | $(1 \sim 2)(S_{11} \sim S_{14}, S_{21} \sim S_{24})$, $(1 \sim 3)(S_{15} \sim S_{18}, S_{25} \sim S_{28})$ | $(C_{1S} + C_{2S})/(C_{1H} + C_{2H} + C_{3H}) = 9.508C_{1H}/4C_{1H}$ | +7.5 |
| 6 | $(1 \sim 3)(S_{11} \sim S_{14}, S_{21-S24})$, $(1 \sim 3)(S_{15} \sim S_{18}, S_{25} \sim S_{28})$ | $(C_{1S} + C_{2S} + C_{3S})/(C_{1H} + C_{2H} + C_{3H}) = 11.3C_{1H}/4C_{1H}$ | +9.0 |
| 7 | $(1 \sim 4)(S_{11} \sim S_{14}, S_{21} \sim S_{24})$, $(1 \sim 3)(S_{15} \sim S_{18}, S_{25} \sim S_{28})$ | $(C_{1S} + C_{2S} + C_{3S} + C_{4S})/(C_{1H} + C_{2H} + C_{3H}) = 13.43C_{1H}/4C_{1H}$ | +10.5 |
| 8 | $1(S_{11} \sim S_{14}, S_{21} \sim S_{24})$, $(1 \sim 2)(S_{15} \sim S_{18}, S_{25} \sim S_{28})$ | $C_{1S}/(C_{1H} + C_{2H}) = 8C_{1H}/2C_{1H}$ | +12.0 |
| 9 | $(1 \sim 2)(S_{11} \sim S_{14}, S_{21} \sim S_{24})$, $(1 \sim 2)(S_{15} \sim S_{18}, S_{25} \sim S_{28})$ | $(C_{1S} + C_{2S})/(C_{1H} + C_{2H}) = 9.508C_{1H}/2C_{1H}$ | +13.5 |
| 10 | $(1 \sim 3)(S_{11} \sim S_{14}, S_{21} \sim S_{24})$, $(1 \sim 2)(S_{15} \sim S_{18}, S_{25} \sim S_{28})$ | $(C_{1S} + C_{2S} + C_{3S})/(C_{1H} + C_{2H}) = 11.3C_{1H}/2C_{1H}$ | +15.0 |
| 11 | $(1 \sim 4)(S_{11} \sim S_{14}, S_{21} \sim S_{24})$, $(1 \sim 2)(S_{15} \sim S_{18}, S_{25} \sim S_{28})$ | $(C_{1S} + C_{2S} + C_{3S} + C_{4S})/(C_{1H} + C_{2H}) = 13.43C_{1H}/2C_{1H}$ | +16.5 |
| 12 | $1(S_{11} \sim S_{14}, S_{21} \sim S_{24})$, $1(S_{15} \sim S_{18}, S_{25} \sim S_{28})$ | $C_{1S}/C_{1H} = 8C_{1H}/8\,C_{1H}$ | +18.0 |
| 13 | $(1 \sim 2)(S_{11} \sim S_{14}, S_{21} \sim S_{24})$, $1(S_{15} \sim S_{18}, S_{25} \sim S_{28})$ | $(C_{1S} + C_{2S})/C_{1H} = 9.508C_{1H}/C_{1H}$ | +19.5 |
| 14 | $(1 \sim 3)(S_{11} \sim S_{14}, S_{21} \sim S_{24})$, $1(S_{15} \sim S_{18}, S_{25} \sim S_{28})$ | $(C_{1S} + C_{2S} + C_{3S})/C_{1H} = 11.3C_{1H}/C_{1H}$ | +21.0 |
| 15 | $(1 \sim 4)(S_{11} \sim S_{14}, S_{21} \sim S_{24})$, $1(S_{15} \sim S_{18}, S_{25} \sim S_{28})$ | $(C_{1S} + C_{2S} + C_{3S} + C_{4S})/C_{1H} = 13.43C_{1H}/C_{1H}$ | +22.5 |

As described above, the present invention makes it possible to generate a differential input signal, which is used as an input to an ADC of an audio CODEC, by using a fully-differential output operational amplifier whose output is transmitted as a differential output.

Also, the present invention gives an advantage of making a chip size smaller than the prior art does, resulting from the fact that resistors are replaced by capacitors and switches while integrating.

What is claimed:

1. A voltage gain amplifier for converting a single input to a differential output, comprising:

a fully-differential output operational amplifying means, which has an inversion input terminal, a non-inversion input terminal, an inversion output terminal and a non-inversion output terminal, for amplifying two inputted signals and then outputting the two amplified signals to the inversion output terminal and the non-inversion output terminal, respectively, a phase of the one output signal being opposite to a phase of the other output signal;

a first single input charging/discharging means connected to said inversion input terminal of said fully-differential output operational amplifying means, for charging/discharging an input voltage as a first signal;

a second single input charging/discharging means for providing a second signal whose phase is inversed compared with a phase of the first signal provided by said first single input charging/discharging means, connected to said non-inversion input terminal of said fully-differential output operational amplifying means;

a first input voltage transferring means, of which one end is connected to said inversion input terminal of said fully-differential output operational amplifying means and the other end is connected to said inversion output terminal, for transferring the first signal by a switching operation;

a second input voltage transferring means, of which one end is connected to said non-inversion input terminal of said fully-differential output operational amplifying means and the other end is connected to said non-inversion output terminal, for transferring the second signal by a switching operation; and a frequency compensating means for outputting the amplified first and second signals of said fully-differential output operational amplifying means which can be stably operated within a given bandwidth.

2. A voltage gain amplifier for converting a single input to a differential output as claimed in claim 1, further comprising a first and second voltage holding means, one end of the first voltage holding means being connected to said inversion input terminal of said fully-differential output operational amplifying means and the other end of the first voltage holding means being connected to said inversion output terminal, one end of the second holding means being connected to said non-inversion input terminal, the other end of the second holding means being connected to said non-inversion output terminal, for decreasing high-frequency noise.

3. A voltage gain amplifier for converting a single input to a differential output as claimed in claim 2, wherein said first voltage holding means comprises a fifth capacitor connected between the inversion input terminal and the inversion output terminal of said fully-differential output operational amplifying means.

4. A voltage gain amplifier for converting a single input to a differential output as claimed in claim 2, wherein said second voltage holding means comprises a sixth capacitor connected between the non-inversion input terminal and the non-inversion output terminal of said fully-differential output operational amplifying means.

5. A voltage gain amplifier for converting a single input to a differential output as claimed in claim 1, wherein said first single input charging/discharging means comprises:

a first switch for switching the input voltage;

a first sampling capacitor of which one end is connected to said first switch;

a second switch connected between the other end of said first sampling capacitor and an inversion input terminal of said fully-differential output operational amplifying means;

a third switch connected between one end of said first sampling capacitor and the ground; and a fourth switch connected between the other end of said first sampling capacitor and the ground.

6. A voltage gain amplifier for converting a single input to a differential output as claimed in claim 5, wherein said second single input charging/discharging means comprises:

a fifth switch for switching the input voltage;

a sixth switch connected between said fifth switch and a non-inversion input terminal of said fully-differential output operational amplifying means;

a second sampling capacitor of which one end being connected between said fifth switch and said sixth switch; and a seventh switch and an eighth switch connected in parallel between the other end of said second sampling capacitor and the ground.

7. A voltage gain amplifier for converting a single input to a differential output as claimed in claim 6, wherein said first input voltage transferring means comprises;

a ninth switch connected to the inversion input terminal of said fully-differential output operational amplifying means;

a third capacitor, one end of which connected to said ninth switch;

a tenth switch connected between the other end of said third capacitor and the inversion output terminal; and an eleventh switch and a twelfth switch each connected between respective end of said third capacitor and the ground.

8. A voltage gain amplifier for converting a single input to a differential output as claimed in claim 7, wherein the first switch, the fourth switch, the fifth switch, the eighth switch, the eleventh switch and the twelfth switch are operated by a clock signal whose phase is opposite to the phase of a clock signal which controls the second switch, the third switch, the sixth switch, the seventh switch, the ninth switch and the tenth switch.

9. A voltage gain amplifier for converting a single input to a differential output as claimed in claim 6, wherein said second input voltage transferring means comprises;

a thirteenth switch connected to the non-inversion input terminal of said fully-differential output operational amplifying means;

a fourth capacitor, one end of which connected to said thirteenth switch;

a fourteenth switch connected between the other end of said fourth capacitor and the non-inversion output terminal; and a fifteenth switch and a sixteenth switch each connected between respective end of said fourth capacitor and the ground.

10. A voltage gain amplifier for converting a single input to a differential output as claimed in claim 9, wherein the first switch, the fourth switch, the fifth switch, the eighth switch, the fifteenth switch and the sixteenth switch are operated by a clock signal whose phase is opposite to the phase of a clock signal which controls the second switch, the third switch, the sixth switch, the seventh switch, the thirteenth switch and the fourteenth switch.

11. A voltage gain amplifier for converting a single input to a differential output as claimed in claim 1, wherein said frequency compensating means comprises:

a seventh capacitor connected between the inversion output terminal and the ground; and an eighth capacitor connected between the non-inversion output terminal and the ground.

12. A voltage gain amplifier for converting a single input to a differential output as claimed in claim 1, wherein said first and second single input charging/discharging means are composed of a plurality of charging/discharging parts connected in parallel, respectively, and said first and second input voltage transferring means also have a plurality of input voltage transferring means whose inter-connection is parallel, respectively.

13. A voltage gain amplifier for converting a single input to a differential output as claimed in claim 12, wherein said first and second single input charging/discharging means and said first and second input voltage transferring means have a 4-stage parallel connection, capacitors have the following relations:

the capacitance of a first-stage capacitor of said first and second input voltage transferring means is the same as the capacitance of a second-stage capacitor of said first and second input voltage transferring means;

the capacitance of a third-stage capacitor of said first and second input voltage transferring means is two times the capacitance of the first-stage capacitor of said first and second input voltage transferring means;

the capacitance of a fourth-stage capacitor of said first and second input voltage transferring means is four times the capacitance of the first-stage capacitor of said first and second input voltage transferring means;

the capacitance of a first-stage capacitor of said first and second single input charging/discharging means is eight times the capacitance of the first-stage capacitor of said first and second input voltage transferring means;

the capacitance of a second-stage capacitor of said first and second single input charging/discharging means is 0.1885 times the capacitance of the first-stage capacitor of said first and second single input charging/discharging means;

the capacitance of a third-stage capacitor of said first and second single input charging/discharging means is 0.22404 times the capacitance of the first-stage capacitor of said first and second single input charging/discharging means; and the capacitance of a fourth-stage capacitor of said first and second single input charging/discharging means is 0.26626 times the capacitance of the first-stage capacitor of said first and second single input charging/discharging means.

* * * * *